(12) United States Patent
Chang et al.

(10) Patent No.: US 8,735,238 B2
(45) Date of Patent: May 27, 2014

(54) METHOD OF FABRICATING A SEMICONDUCTOR DEVICE INCLUDING HIGH VOLTAGE AND LOW VOLTAGE MOS DEVICES

(75) Inventors: ChanSam Chang, Seoul (KR); Shigenobu Maeda, Seongnam-si (KR); HeonJong Shin, Yongin-si (KR); ChangBong Oh, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 611 days.

(21) Appl. No.: 13/039,525

(22) Filed: Mar. 3, 2011

(65) Prior Publication Data
US 2011/0151642 A1    Jun. 23, 2011

Related U.S. Application Data

(62) Division of application No. 11/523,068, filed on Sep. 19, 2006, now Pat. No. 7,923,805.

(30) Foreign Application Priority Data

Dec. 21, 2005  (KR) .................. 10-2005-0127042

(51) Int. Cl.
*H01L 21/8238* (2006.01)
(52) U.S. Cl.
USPC ........... 438/199; 438/224; 438/227; 438/228; 438/232; 438/527
(58) Field of Classification Search
USPC .......... 257/369, 371, 408, 409, 344; 438/199, 438/224, 227, 228, 232, 527
See application file for complete search history.

(56) References Cited

U.S. PATENT DOCUMENTS

| | | | |
|---|---|---|---|
| 4,928,159 A * | 5/1990 | Mihara et al. | 257/370 |
| 5,498,554 A | 3/1996 | Mei | |
| 6,365,932 B1 | 4/2002 | Kouno et al. | |
| 6,451,640 B1 * | 9/2002 | Ichikawa | 438/199 |
| 6,465,768 B1 * | 10/2002 | Ker et al. | 250/214.1 |
| 6,720,222 B2 * | 4/2004 | Kanda et al. | 438/289 |
| 6,879,007 B2 | 4/2005 | Takamura | |

(Continued)

FOREIGN PATENT DOCUMENTS

| CN | 1135623 | 1/2004 |
|---|---|---|
| EP | 1263033 A1 | 12/2002 |

(Continued)

OTHER PUBLICATIONS

Chinese Office Action 200610171225.9 dated May 8, 2009.
Japanese Office Action Dated Feb. 14, 2012.
Japanese Office Action Dated Jun. 12, 2012.

*Primary Examiner* — Bilkis Jahan
(74) *Attorney, Agent, or Firm* — Volentine & Whitt, PLLC

(57) ABSTRACT

Methods and devices for forming both high-voltage and low-voltage transistors on a common substrate using a reduced number of processing steps are disclosed. An exemplary method includes forming at least a first high-voltage transistor well and a first low-voltage transistor well on a common substrate separated by an isolation structure extending a first depth into the substrate, using a first mask and first implantation process to simultaneously implant a doping material of a first conductivity type into a channel region of the low-voltage transistor well and a drain region for the high-voltage transistor well.

19 Claims, 10 Drawing Sheets

(56) References Cited

U.S. PATENT DOCUMENTS

| | | |
|---|---|---|
| 6,884,682 B2 | 4/2005 | Lee |
| 2001/0028065 A1* | 10/2001 | Io .................................. 257/100 |
| 2003/0059983 A1 | 3/2003 | Ota et al. |
| 2005/0116265 A1* | 6/2005 | Inoue et al. ................... 257/288 |
| 2006/0022278 A1* | 2/2006 | Pan et al. ...................... 257/369 |
| 2006/0063316 A1* | 3/2006 | Yamagata et al. ............ 438/174 |
| 2007/0132033 A1* | 6/2007 | Wu et al. ....................... 257/371 |

FOREIGN PATENT DOCUMENTS

| | | |
|---|---|---|
| JP | 05-090400 | 4/1994 |
| JP | 09-097898 | 4/1997 |
| JP | 2003-249570 | 9/2003 |
| JP | 2004-235527 | 8/2004 |
| KR | 1020030009766 A | 2/2003 |

* cited by examiner

METHOD OF FABRICATING A SEMICONDUCTOR DEVICE INCLUDING HIGH VOLTAGE AND LOW VOLTAGE MOS DEVICES

CROSS-REFERENCE TO RELATED APPLICATION

This is a divisional of U.S. patent application Ser. No. 11/523,068 filed on Sep. 19, 2006, which issued as U.S. Pat. No. 7,923,805 on Apr. 11, 2011, the subject matter of which is incorporated herein by reference in its entirety.

BACKGROUND OF THE INVENTION

1. Field of the Invention

Embodiments of the invention relate generally to semiconductor devices. More particularly, embodiments of the invention relate to semiconductor devices having a combination of low-voltage and high-voltage transistors and methods of manufacturing of these semiconductor devices.

This application claims priority to Korean Patent Application 10-2005-0127042, filed on Dec. 21, 2005, the subject matter of which is hereby incorporated by reference in its entirety.

2. Description of the Related Art

Manufacturers of electronic goods are under constant pressure to supply devices having expanded functionality and lower prices. One example is the wireless cellular phone, where staunch competition between manufacturers and resellers has kept cellular phone prices down even as the range of cellular phone functionality has expanded dramatically. Indeed, cellular telephones now include such capabilities as e-mail, web-browsing, text-messaging, music storage, photography, and video playback.

In order to facilitate the trend towards expanded device functionality at lower prices, manufacturers must develop not only new processing architectures and algorithms, but also new semiconductor technologies allowing denser device integration at lower fabrication costs. However, increased device integration often requires a blending of heretofore incompatible technologies into a common device substrate.

Many contemporary electronic devices, such as cellular telephones, benefit from the inclusion of low-voltage (<3.3 VDC) CMOS devices (e.g., transistors) in the implementation of various circuitry (e.g., data encryption and decryption). However, the same electronic devices also benefit from the inclusion of relatively high-voltage (>5 VDC) devices in the implementation of other circuitry (e.g., modulators/demodulators and power amplifiers). Unfortunately, high-voltage devices do not generally function effectively at low-voltages, and the low-voltage devices can be damaged by high-voltages. These facts often resulted in the conventional provision of separate integrated circuits, one implemented in low voltage devices and another implemented in high voltage devices, within a host device. However, such an approach to dealing with the common provision of different types of devices are simple not possible under emerging pressures related to integration densities and fabrication costs.

To remedy this problem, a host of technical solutions has been developed. For example, a device known as an "asymmetric" metal-oxide-semiconductor (MOS) transistor has been proposed. In this type of MOS device, the drain region is substantially expanded in relation to a corresponding source region. With this structure, an asymmetric MOS transistor may be implemented within a predominantly low-voltage system, and yet operate at relatively high voltages without significant risk of damage.

FIG. 1 depicts an exemplary asymmetric MOS transistor 10 embedded between two shallow trench isolation (STI) structures 14. As shown in FIG. 1, asymmetric MOS transistor 10 is a p-channel MOS-type transistor having a gate 11 formed over a p-doped well 15. A source electrode 12 is connected to a heavily n-doped source region 17, and a drain electrode is connected to a heavily n-doped drain region 18. A lightly n-doped region surrounds heavily n-doped drain region 18.

The lightly n-doped well/region surrounding heavily n-doped drain region 18 imparts two properties to transistor 10. First, the effective channel length (LEFF) under gate 11 is reduced. Second, drain region 18 is effectively enlarged, which consequently gives asymmetric MOS transistor 10 a higher breakdown voltage (i.e., a greater ability to withstand higher applied voltages).

One particular example of an asymmetric MOS transistor is disclosed in U.S. Pat. No. 6,624,487, the subject matter of which is hereby incorporated by reference. A similar device is illustrated in FIG. 2.

In FIG. 2, a pair of asymmetric MOS transistors 32, 34 are provided in an electrostatic discharge (ESD) circuit. In first MOS transistor 32, a gate electrode 45 overlaps a portion of a lightly n-doped well 42 in which a heavily n-doped drain 44 is disposed. Similarly, for second MOS transistor 34, gate electrode 49 overlaps a portion of a lightly n-doped well 51 in which a heavily n-doped drain 48 is disposed. In the illustrated example, the drains of first and second MOS transistors 32, 34 are commonly connected to a terminal (not shown). Corresponding gates 45, 49 of respective first and second MOS transistors 32, 34 are also commonly connected. The deep drain-extended junctions, located at the interface between N-wells 42, 51 and substrate 40, provide a large junction area capable of handling a substantial current passing from substrate 40 to the above-mentioned terminal when forward-biased by a negative polarity ESD event.

While the asymmetric MOS transistors 32, 34 of FIG. 2 have proven useful for handling relatively high-voltages, they may suffer from an absence (or inadequate) of electrical isolation between one another, and between other proximate devices. To counter this electrical isolation problem, two additional structures are routinely included within substrates incorporating asymmetric MOS transistors adapted for use with relatively high applied voltages. These additional structures are sometimes referred to as "guard rings" and "triple wells".

FIG. 3 conceptually illustrates the use and placement of guard rings 86 and a triple well 84 within a semiconductor device 70. The generalized semiconductor device 70 includes, for example, an n-channel transistor 82 and a p-channel transistor 80 separated, and surrounded by, a number of shallow trench isolation (STI) structures 74. In turn, STI structures 74 are separated by intermediate N-wells biased to VDD and intermediate P-wells biased to VSS. The consequential effect of STI structures 74 and intermittent N-wells and P-wells, which collectively form guard rings 86, is one of increased electrical isolation between transistors 80 and 82, as well as to other proximate devices.

Triple-well 84 is also illustrated in FIG. 3 and is disposed under an enlarged P-well region of transistor 82. Triple well 84 is typically formed from a lightly n-doped region adjacent to the enlarged P-well. As with guard rings 86, triple-well 84 substantially increases the electrical isolation of transistor 82 with respect to other devices proximately disposed on the substrate, and more particularly prevents current leakage from the P-well through the P-type substrate.

While guard rings and triple-wells may be used to effectively isolate asymmetric MOS devices on a substrate, their formation significantly complicates and increases the cost of the overall fabrication process. That is, the provision of guard rings and triple-wells consumes increasingly scarce substrate area, and requires the use of additional fabrication masks. Accordingly, new technology related to the cost effective fabrication and incorporation of asymmetric MOS devices within a substrate is highly desirable.

SUMMARY OF THE INVENTION

Embodiments of the invention provide semiconductor devices comprising both high voltage asymmetric devices and low voltage devices on the same substrate. These disparate device types may nonetheless be formed on the substrate through an efficient fabrication process sequence comprising a reduced number of individual fabrication processes. For example, embodiments of the invention allow the use of fewer masks in the fabrication of semiconductor devices containing both high voltage asymmetric devices and low voltage devices.

Thus, in one embodiment, the invention provides a semiconductor device comprising; high voltage asymmetric NMOS and PMOS devices and low voltage NMOS and PMOS devices disposed on a substrate and separated by a plurality of isolation structures disposed in the substrate to a first depth, wherein a drain region of the high voltage NMOS device and a channel region of the low voltage PMOS device are characterized by a first dopant implantation of second depth, and a drain region of the high voltage PMOS device and a channel region of the low voltage NMOS device are characterized by a second dopant implantation of third depth, and wherein the second and third depths are less than the first depth.

In related embodiments, the second and third depths are substantially equal, and/or the ratio of either the second depth to the first depth, or the third depth to the first depth ranges from between about one-third to one-half.

In related embodiments, each one of the high voltage asymmetric NMOS and PMOS devices and the low voltage NMOS and PMOS devices comprises a gate oxide layer of substantially similar thickness.

In some related embodiments, the respective drain regions for the high voltage asymmetric NMOS and PMOS devices may be Lightly Doped Drain (LLD) regions or halo implantation regions.

In another embodiment, the invention provides a method for forming both high-voltage and low-voltage transistors on a substrate, the method comprising; forming at least a first high-voltage transistor well and a first low-voltage transistor well in the substrate separated by an isolation structure extending a first depth into the substrate, and using a first implantation process to simultaneously implant a dopant of first conductivity type to a second depth in the substrate to form a channel region in the first low-voltage transistor well and a drain region in the first high-voltage transistor well, wherein the second depth is less than the first depth.

In a related embodiment, the method may further comprise; forming at least a second high-voltage transistor well and a second low-voltage transistor well in the substrate separated by an isolation structure extending the first depth into the substrate, and using a second implantation process to simultaneously implant a dopant of second conductivity type to a third depth in the substrate to form a channel region in the second low-voltage transistor well and a drain region in the second high-voltage transistor well, wherein the third depth is less than the first depth.

DESCRIPTION OF THE DRAWINGS

Embodiments of the invention are described hereafter with reference to the accompanying drawings. It should be noted that various features are not necessarily drawn to scale. In fact, certain dimensions may be arbitrarily increased or decreased in relative size to provide additional clarity. Like reference numerals refer to like or similar elements.

DESCRIPTION OF EMBODIMENTS

Figure 1:
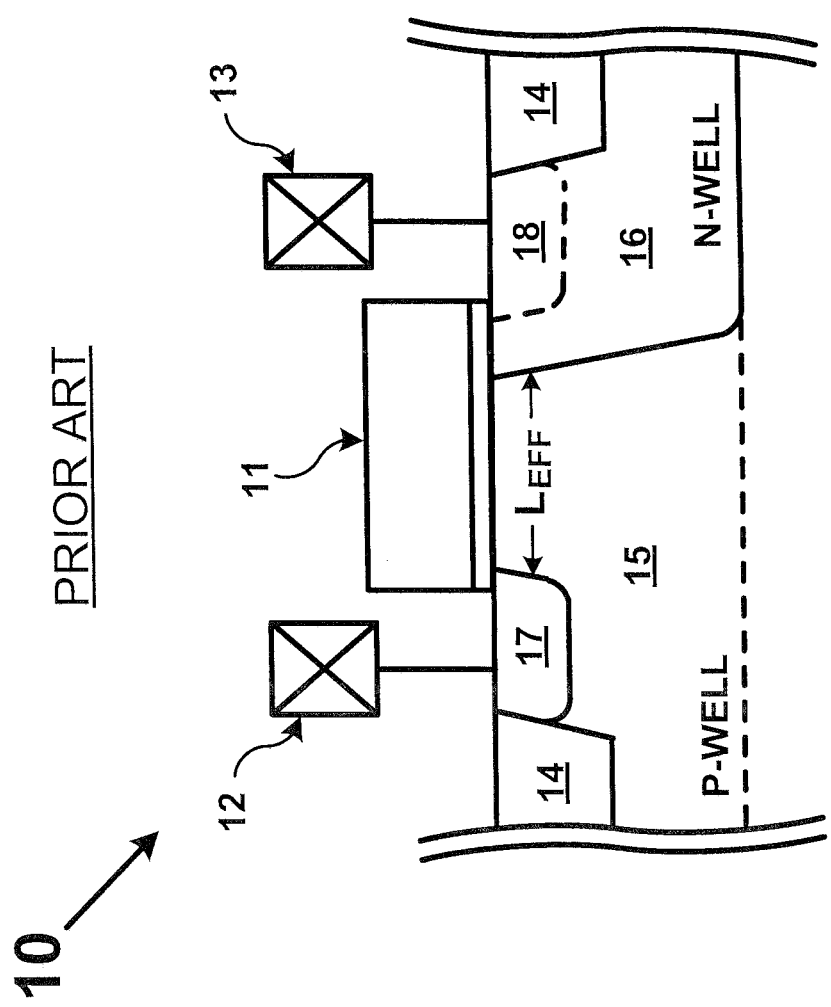
FIG. 1 depicts an exemplary asymmetric MOS transistor.
Figure 2:
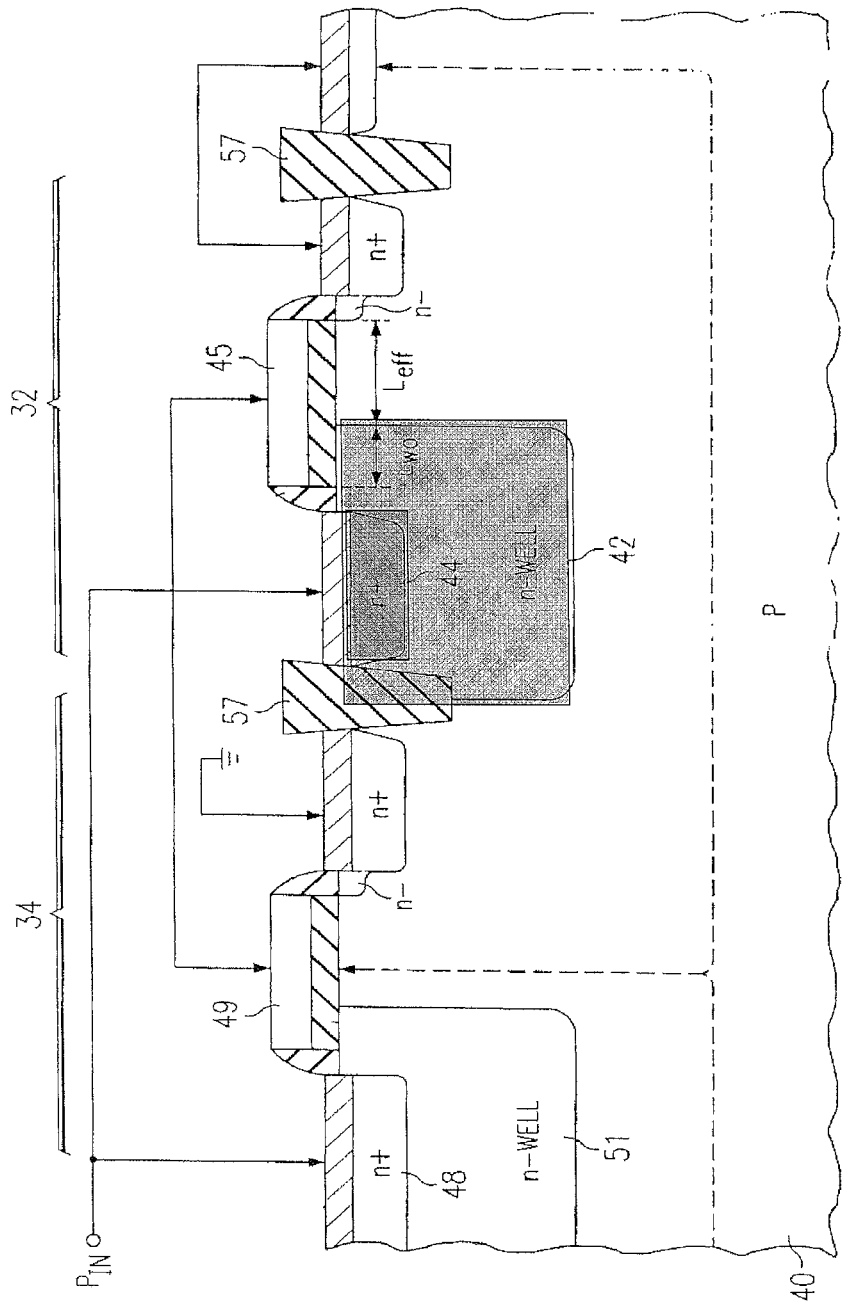
FIG. 2 depicts a number of asymmetric MOS transistors arranged in an exemplary circuit.
Figure 3:
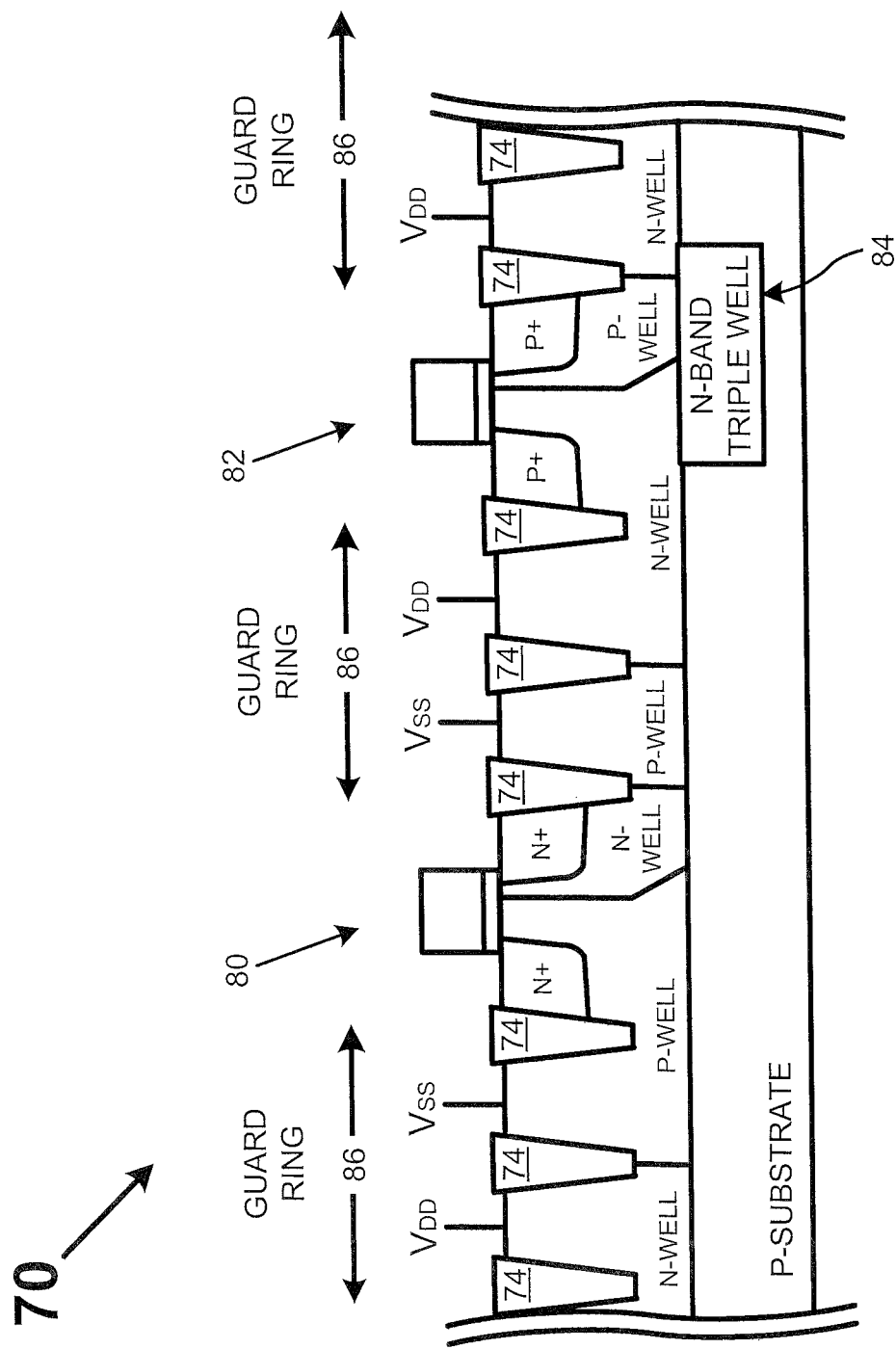
FIG. 3 depicts asymmetric MOS transistors arranged on a substrate with related guard rings and triple-well isolation structures.

In the following description, several embodiments of the invention are set forth. Those of ordinary skill in the art will recognize that the invention may, however, be variously embodied. Thus, the scope of the invention as defined by the claims that follow is not limited to only the disclosed embodiments, but extends to modifications, alterations and extrapolations of the inventive subject matter described hereafter. Within the context of this description, particular dispositions of certain well-known apparatuses and methods may be omitted so as to not obscure the description of the inventive aspects of the embodiments.

For purposes of clarity and simplicity, the following description is generally directed to semiconductor device(s) formed on a p-doped substrate. However, it should be appreciated that various embodiments utilizing an n-doped substrate might alternatively be used—by taking into account the various adjustments in the related manufacturing processes and materials.

FIGS. 4-9 collectively illustrate various fabrication processes and exemplary technologies adapted to the manufacture of semiconductor device(s) having both low-voltage and high-voltage devices (e.g., transistors). The individual fabrication processes are merely exemplary of a range of fabrication processes that might be used by those skilled in the art. The scope of the invention is not specifically limited to a particular type or order of the exemplary fabrication processes, unless expressly indicated in the description.

As noted above, the description that follows is made in relation to the accompanying drawings. The figures in the drawings show only necessary portions and/or selected elements of much larger devices. Certain spatially related descriptive terms may be used in the context of the following description. Such terms do not limit the actual fabrication layout and disposition of elements on a substrate. They merely serve to explain in a clear manner certain exemplary relationships and fabrication approaches.

For example, the term "on" may be used to denote the disposition or formation of one element, region or layer "directly on" another element, region or layer, or on another element, region or layer with intervening elements, regions or layers being present. Other terms such as top and bottom, vertical and horizontal (or lateral), upper and lower, etc., should be generally construed as merely being indicative of exemplary, relative spatial relationships between the elements, regions, and layers illustrated in the figures.

Figure 4:
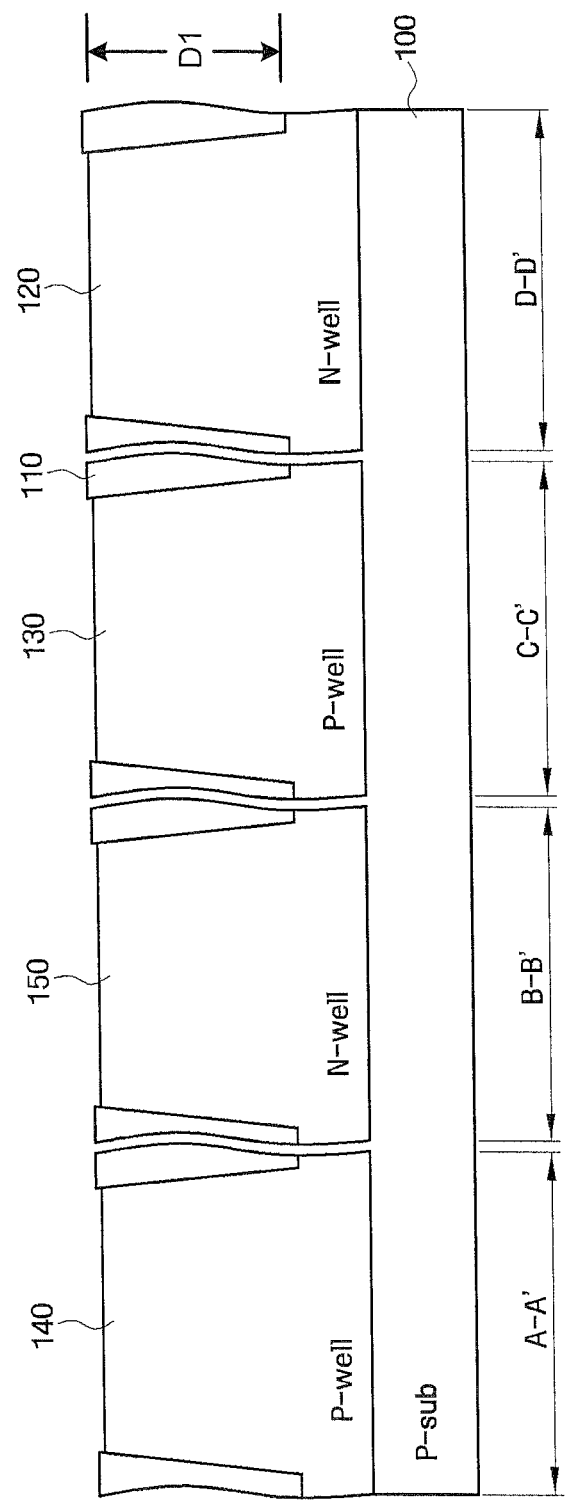
FIGS. 4-9 depict an exemplary method of manufacture according to one embodiment of the invention.

In the embodiment illustrated in FIG. 4, a P-type substrate 100 comprises various device regions, generally indicated A-A', B-B', C-C' and D-D'. Substrate 100 may be formed from a number of useful semiconductor and semi-insulating materials known in the art, such as silicon, silicon-on-insulator, gallium-arsenide, silicon-germanium, a ceramic, etc.

Although the device regions A-A', B-B', C-C' and D-D' are commonly illustrated in FIG. 4, they may be widely separated in their respective dispositions across substrate 100. Hence, the broken lines separating the respective device regions in the figures generally indicate any defined spatial relationship between the various device regions on substrate 100.

Figure 9:
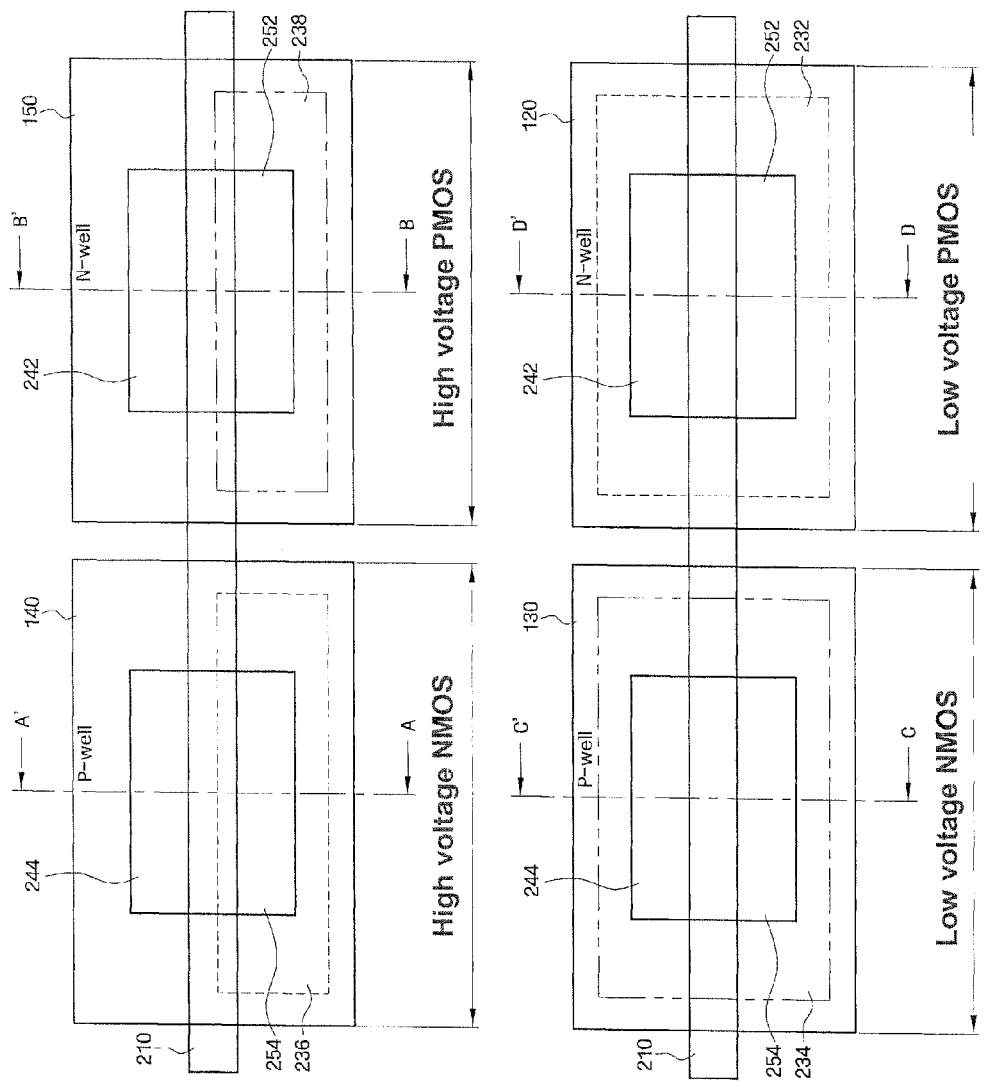

As shown in FIG. 4, exemplary substrate 100 is assumed to be lightly doped with P-type impurities (i.e. "P-type") and populated with a plurality of isolation structures 110. In the illustrated embodiment, each isolation structure 110 may be substantially formed to a first depth (D1) within substrate 100 using any one of several conventionally understood techniques. The actual geometry and depth of isolation structures 110 will vary by design, but in general the layout and geometry of isolation structures 110 serve to define, at least in part, the spatial relationship between the device regions formed in substrate 100 (e.g., device regions A-A', B-B', C-C' and D-D'). Device regions A-A', B-B', C-C' and D-D' are variously doped using known techniques to form respective N-type and P-type wells 120 through 150. (Of note, FIG. 9 is a layout or top-down perspective further illustrating an embodiment of the invention comprising well regions 120 through 150).

In one embodiment, isolation structures 110 are formed using a conventionally understood class of fabrication techniques referred to as shallow-trench isolation (STI). However, other fabrication techniques (e.g., plasma etching and fill), both presently known or later-developed, might alternately be used to form isolation structures 110. In one embodiment, isolation structures 110 are formed from silicon nitride, but other materials may be alternatively or additionally used. In one embodiment, isolation structures 110 extend into substrate 100 by a first depth D1, ranging from about 2,500 angstroms to 3,000 angstroms. However, first depth D1 will vary by application and design.

Of further note, the plurality of isolation structures, while characterized by a first depth extending "into" (i.e., below the upper surface of) substrate 100, may in some embodiments also extend above the upper surface of the substrate by a slight amount, as required for certain designs. Such additional geometric properties are not precluded by a description of the isolation structures as "extending into the substrate by a first depth."

The P-type impurity materials (i.e., one or more "dopants") used to define the conductivity properties of substrate 100, as well as the conductivity properties of P-wells 130 and 140, may be drawn from a number of known or later developed materials adapted to the formation of P-type conductivity regions in a substrate and/or material layer(s) formed on the substrate. One or more N-type dopants, known or later developed, may be used to define the conductivity properties of N-wells 120 and 150 as formed in P-type substrate 100. Doping or implantation of P-type and N-type impurities, whether general or selective, may be accomplished using a number of conventionally understood techniques.

Thus, in the illustrated example, N-wells 120 and 150 may be formed by selectively implanting one or more N-type dopants into appropriate locations of P-type substrate 100. Of course, when alternately using an N-type substrate, P-wells may be similarly formed by selectively implanting one or more P-type dopants into appropriate regions of the N-type substrate.

For purposes of the description that follows, it should be appreciated that high-voltage transistors are subsequently formed in wells 140 and 150, and low-voltage transistors are subsequently formed in wells 130 and 120. Recognizing this fact, the various wells may be referred to as "high voltage and low voltage transistor wells". Further, in one embodiment, the high-voltage transistors formed in wells 140 and 150 are formed as asymmetric MOS transistors, characterized in their operation by the geometry and impurity doping concentrations of their respective drain regions.

Figure 5:
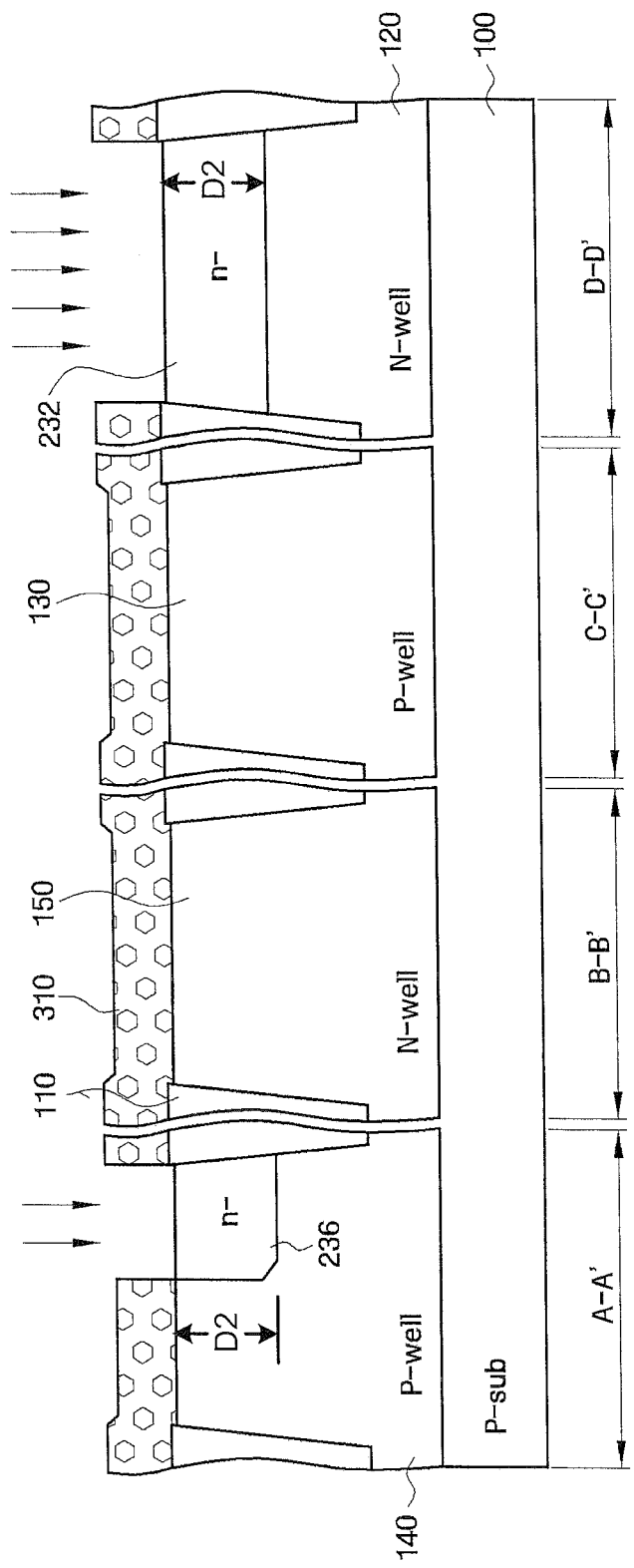

With reference to FIG. 5, substrate 100 of FIG. 4 undergoes further fabrication processing to add a first photoresist layer (e.g., a mask) 310 substantially covering wells 120 through 150 and associated isolation structures 110. Photoresist mask 310 may then be etched to expose portions of low-voltage N-well 120 and high-voltage P-well 140. Alternatively, these regions may be exposed by a region selective formation of first photoresist mask 310. In the illustrated example, at least one N-type dopant is then implanted into a channel doping region 232 of low-voltage N-well 120 and a drain region 236 of high-voltage P-well 140 using a (first) dopant implantation process.

In one embodiment, the depth of this channel doping region implantation extends to a second depth D2 of about 1,000 angstroms±10%. However, other embodiments will benefit from different second depth D2 implantations according to their design. For example, the second depth D2 may vary as a function of the first depth D1 (or vice versa), and that the ratio of depths D2/D1 may serve as a useful design parameter. In certain embodiments of the invention, the ratio D2/D1 may vary from between about ⅓ to ½.

By extending the first depth of isolation structures 110 to be substantially greater than (e.g., farther below the upper surface of substrate 100) the second depth of the first implantation process used to form channel doping region 232 and drain region 236, embodiments of the invention are well adapted to reduce or entirely eliminate the need for associated guard rings and/or triple well structures mandated by conventional practice. Thus, in many applications where substrate surface area is very limited, guard rings and triple wells may be completely eliminated. In other applications less sensitive to surface area constraints and benefiting from additional electrical isolation, however, guard rings and triple wells may be added to provide additional electrical isolation.

Figure 6:
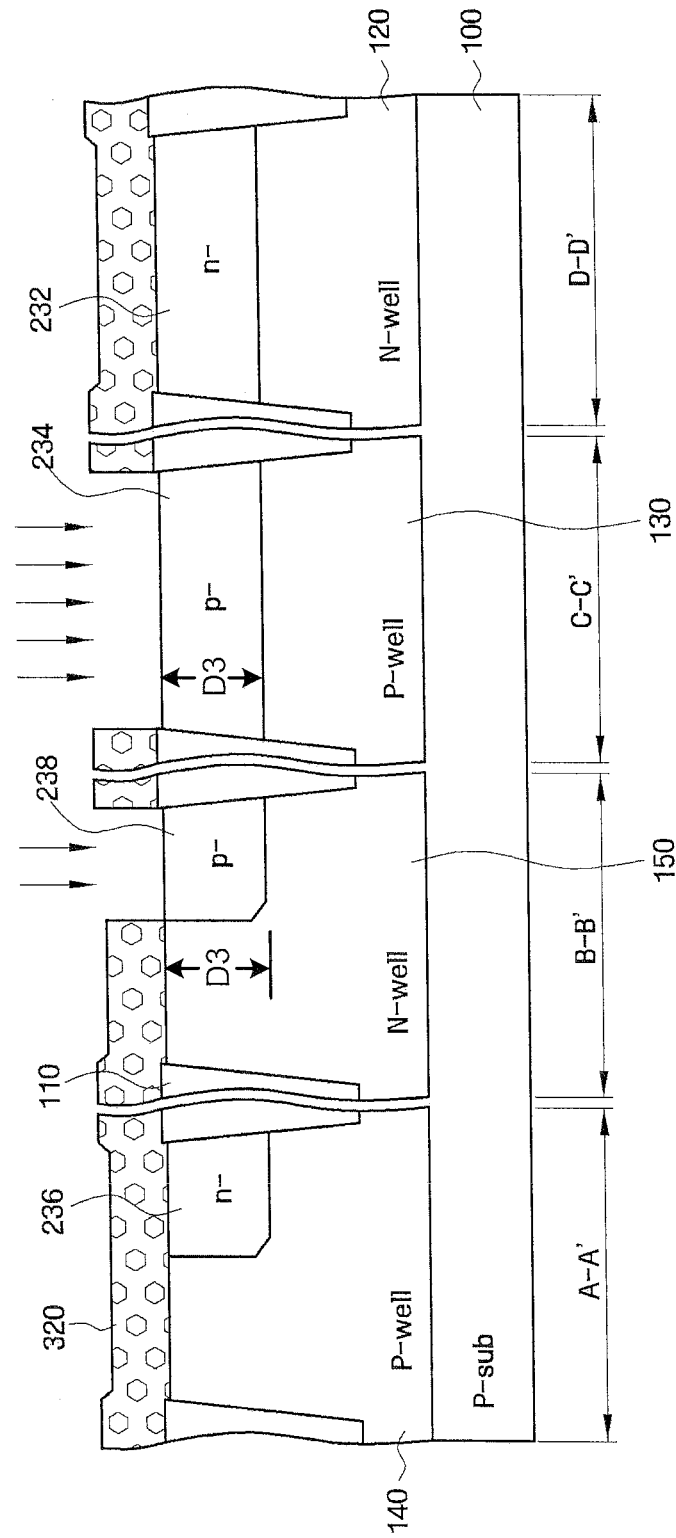

With reference to FIG. 6 and following removal of first photoresist mask 310, a second photoresist layer (e.g., another mask) 320 is selectively formed (or formed and partially etched) to expose portions of the device regions corresponding to low-voltage P-well 130 and high-voltage N-well 150. At least one P-type dopant is then selectively implanted to a third depth D3 to form a channel doping region 234 of low-voltage P-well 130 and a drain region 238 of high-voltage N-well 150.

In the illustrated embodiment, the third depth D3 of the second implantation process may be substantially equal to the second depth D2 provided by the first dopant implantation process. However, other embodiments may vary this relationship to be substantially unequal. Indeed, third depth D3 may be characterized in its formation in a manner similar to that of second depth D2 (e.g., size, respective element depth ratios, relative impurity concentrations, etc.).

Of note, the drain region of the high-voltage asymmetric MOS transistor to be formed in P-well 140 is formed simultaneously with the channel doping region of the low-voltage transistor to be formed in N-well 120. Similarly, the drain region of the high-voltage asymmetric MOS transistor to be formed in N-well 150 is formed simultaneously with the channel doping region of the low-voltage transistor to be formed in P-well 130. This aspect of the illustrated embodiment allows a reduction in the number of essential masks and/or implantation processes required to form both low-voltage and high-voltage devices, thereby simplifying the overall manufacturing process and reducing costs.

Figure 7:
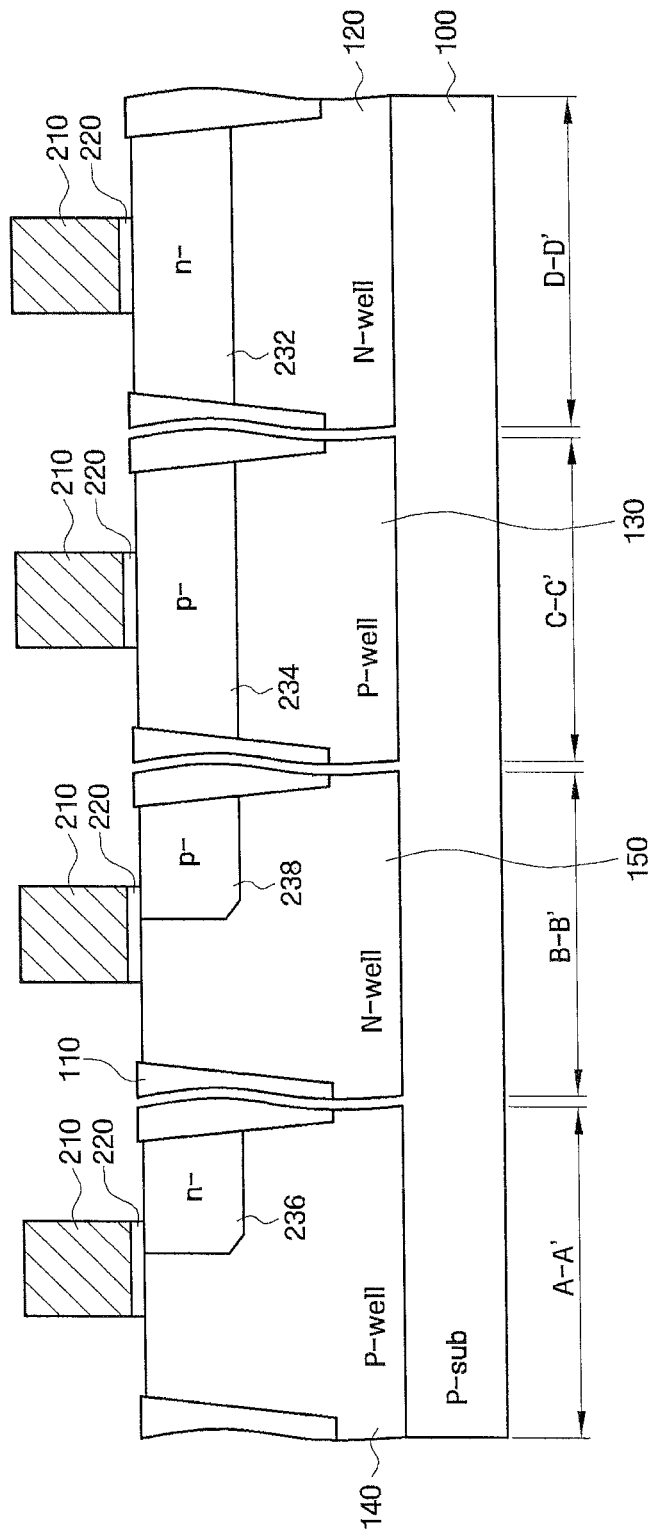

FIG. 7 depicts the substrate 100 of FIG. 6 with the addition of respective gate structures comprising gate oxide layer isolation barriers 220 and gate electrodes 210 appropriately placed over channel regions identified in respective wells 120 through 150. The formation of these gate structures is well understood by those of ordinary skill in the art, and will vary design and implementing technologies.

In the illustrated embodiment, the thickness of the respective gate oxides layer 220 formed on high-voltage transistor wells 140 and 150 is the same as the thickness of the gate oxides 220 formed on low-voltage transistor wells 120 and 130. While this relationship need not be the case for every embodiment of the invention, the reduced fabrication costs and overall complexity (e.g., the required number of masks) associated with certain embodiments of the invention having this relationship are worthy of serious design consideration. Of note, conventional designs incorporating both high-voltage and low-voltage devices generally require that the gate oxide associated with high-voltage devices be thicker than a gate oxide associated with low-voltage devices. Hence, additional masking and gate oxide formation and patterning processes are required.

Figure 8:
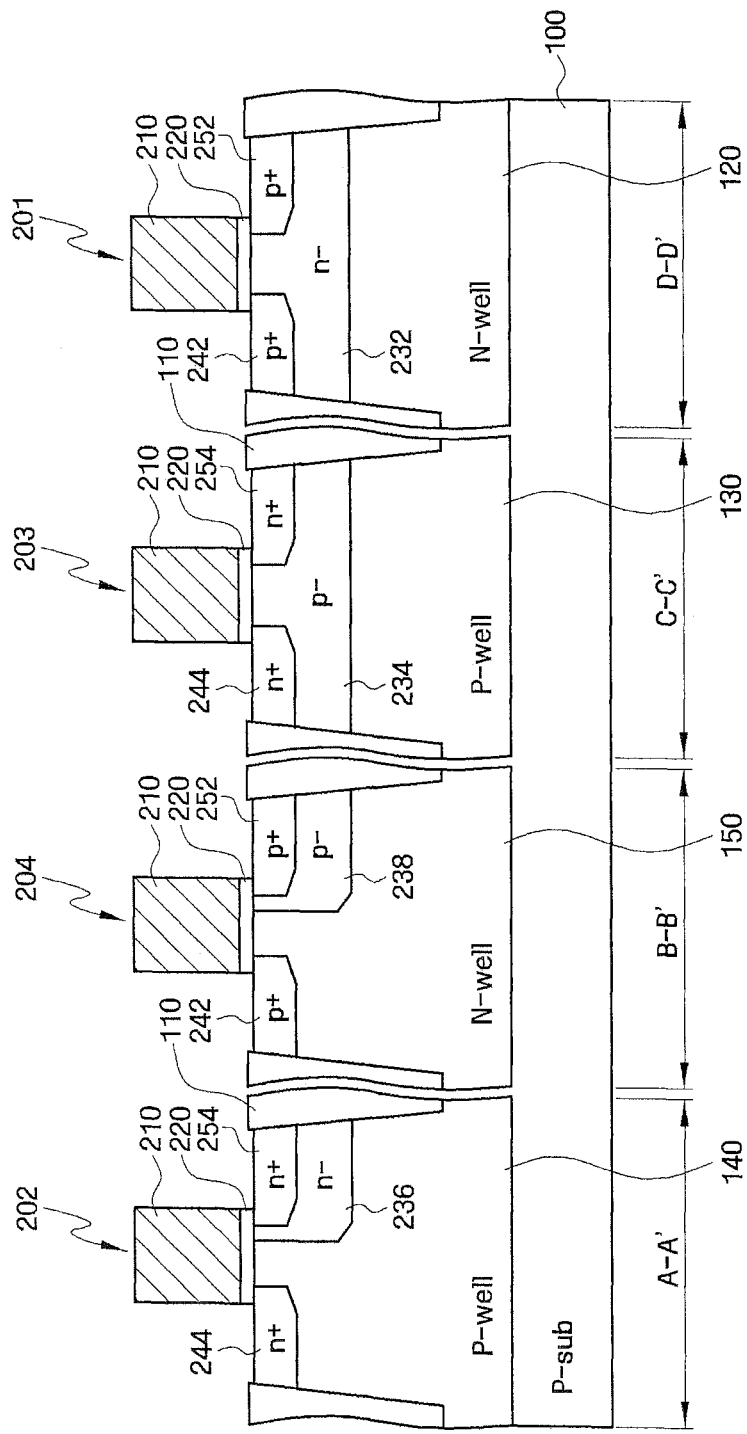

FIG. 8 depicts the substrate of FIG. 7 following the additional formation of appropriate N-type and P-type regions adapted for use as source regions 242 through 244 and drain regions 252 through 254. Those of ordinary skill in the art will recognize that considerable latitude may be afforded the designer in this regard. That is, many different techniques may be effectively used to selectively implant dopants competent to form the respective source and drain regions within P-type and N-type wells 120 through 150. For example, the respective drain regions may be formed as Lightly-Doped Drain (LLD) or HALO drain structures. These more specific type of drain structures are conventionally understood and may readily be incorporated within embodiments of the invention.

In one embodiment of the invention, however, a single N-type dopant implantation process (e.g., using a single mask) may be used to selectively form N+ type source regions 244 and N+ drain regions 254 in the respective P-type wells 130 and 140. Analogously, a single P-type dopant implantation process (e.g., using a second single mask) may be used to selectively form P+ type source regions 242 and P+ drain regions 252 in the respective N-type wells 120 and 150.

With proper connection to signaling and/or control sources via conventionally understood techniques, the foregoing combination of exemplary source, drain and gate elements may be used to construct: a low-voltage N-type transistor 201 in N-well 120; a high-voltage asymmetric P-type transistor 202 in P-well 140; a low-voltage P-type transistor 203 in P-well 130; and, a high-voltage asymmetric N-type transistor 204 in N-well 150.

FIG. 9 shows in a top-down view the various device regions A-A', B-B', C-C' and D-D' populated by P-well and N-wells 120 through 150 and related elements as described in relation to FIGS. 4-8. Note that the four resultant transistors 201 through 204 may be formed as complementary MOS pairs in relation to both low-voltage and high-voltage devices.

Figure 10:
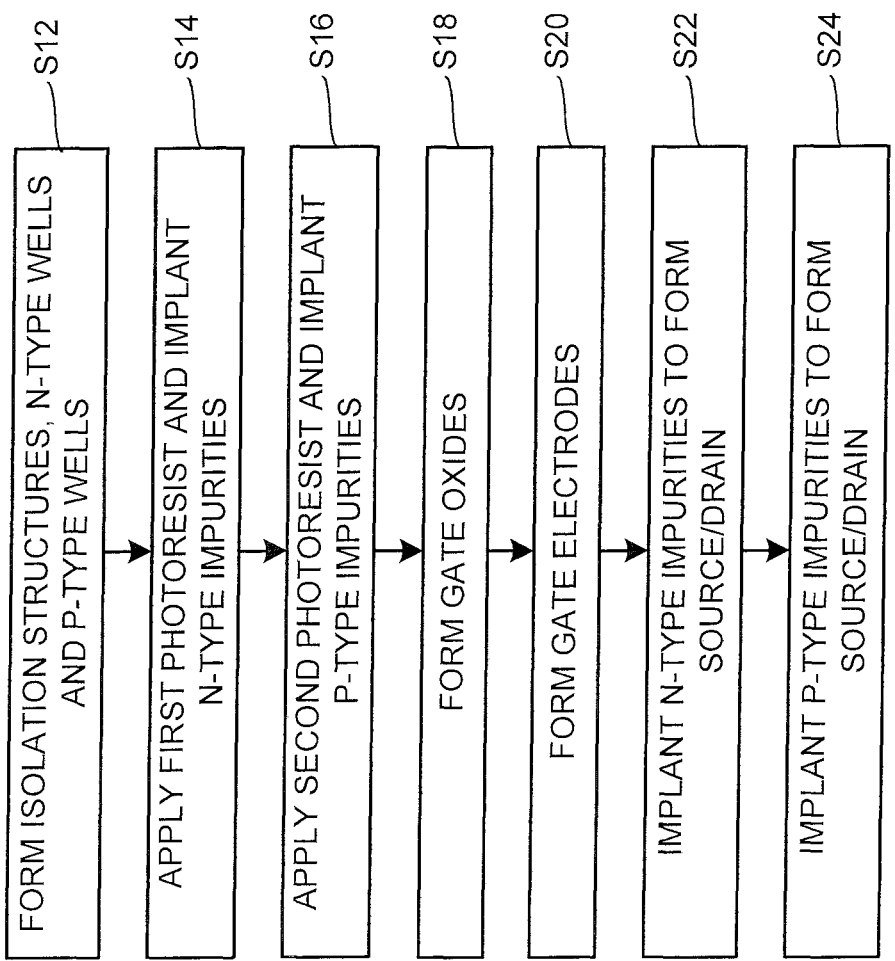
FIG. 10 is flow chart illustrating an exemplary fabrication sequence adapted to manufacture a semiconductor device consistent with an embodiment of the invention.

FIG. 10 is a flowchart outlining an exemplary sequence of fabrication processes adapted to the manufacture of a semiconductor device having both low-voltage and high-voltage transistors in accordance with one embodiment of the invention. Referring to FIG. 10, isolation structures are formed in a substrate and P-well and N-wells are formed in relation to the isolation structures (S12). Next, a first photoresist mask is applied and patterned to selectively expose portions of the surface of the substrate, and N-type impurities are implanted through the first photoresist mask (S14). Then, a second photoresist mask is applied and patterned to selectively expose other portions of the surface of the substrate, and P-type impurities are implanted through the second photoresist mask (S16).

Gate oxides are formed (S18), and gate electrodes are formed (S20).

Following formation of the respective gate electrode structures, N-type impurities are implanted to form source/drain regions (S22), and P-type impurities are implanted to form source/drain regions (S24).

In the foregoing, it should be noted that when a NMOS or PMOS device is said to be formed "on" a substrate, such a description contemplates that certain elements of the NMOS or PMOS device may, in fact, be formed "in" the substrate. Nonetheless, for purposes of brevity, such devices are said to be disposed "on" the substrate.

Many features and advantages of the invention are apparent from the foregoing description. It is intended that appended claims cover all such features and advantages that fall within the scope of the invention. Further, since numerous modifications and variations will readily occur to those skilled in the art, it is not desired to limit the invention to the exact construction and operation illustrated and described. But rather, all such modifications and equivalents fall within the scope of the invention.

What is claimed is:

1. A method for forming both high-voltage and low-voltage transistors on a substrate, the method comprising:

forming first and second high-voltage transistor wells and first and second low-voltage transistor wells in the substrate, wherein the first high voltage well, the second high voltage well, the first low voltage well, and the second low voltage well are respectively separated by isolation structures extending a first depth into the substrate;

using a first implantation process to simultaneously implant a dopant of first conductivity type to a second depth in the substrate to form a channel region in the first low-voltage transistor well and a drain region in the first high-voltage transistor well; and using a second implantation process to simultaneously implant a dopant of second conductivity type to a third depth in the substrate to form a channel region in the second low-voltage transistor well and a drain region in the second high-voltage transistor well, wherein the second depth and the third depth are each less than the first depth.

2. The method of claim 1, wherein the first implantation process uses a single mask to form the channel region in the first low-voltage transistor well and the drain region in the first high-voltage transistor well.

3. The method of claim 1, wherein the second implantation process uses a single mask to form the channel region in the second low-voltage transistor well and the drain region in the second high-voltage transistor well.

4. The method of claim 1, wherein the second and third depths are substantially equal.

5. The method of claim 1, further comprising:
forming the isolation structures using a shallow trench isolation (STI) technique.

6. The method of claim 1, wherein a ratio of the second depth to the first depth ranges from between about one-third to one-half.

7. The method of claim 1, further comprising:
respectively forming first and second high voltage asymmetric transistors in the first and second high voltage transistor wells with a gate oxide layer of first thickness; and
respectively forming first and second low voltage transistors in the first and second low voltage transistor wells with a gate oxide layer of second thickness.

8. The method of claim 7, wherein the first thickness and the second thickness are substantially equal.

9. The method of claim 7, wherein the first and second high voltage asymmetric transistors are formed adjacent to one another on the substrate as a complementary pair.

10. The method of claim 7, wherein the first and second low voltage transistors are formed adjacent to one another on the substrate as a complementary pair.

11. The method of claim 7, wherein respective drain regions for the first and second high voltage asymmetric transistors are Lightly Doped Drain (LLD) regions.

12. The method of claim 7, wherein at least one of the first and second dopant implantation processes is a halo ion implantation process.

13. The method of claim 1, wherein the substrate comprises at least one of silicon, silicon-on-insulator, gallium-arsenide, silicon-germanium, and ceramic.

14. The method of claim 1, wherein the first depth ranges from between about 2500 to 3000 angstroms.

15. The method of claim 14, wherein at least one of the second and third depths ranges from between about 900 to 1100 angstroms.

16. The method of claim 1, wherein a ratio of the third depth to the first depth ranges from between about one-third to one-half.

17. A method for forming both high-voltage and low-voltage transistors on a substrate, the method comprising:
forming first P-well, a second P-well, a first N-well and a second N-well in the substrate, wherein the first P-well, the second P-well, the first N-well, and the second N-well are respectively separated by isolation structures extending a first depth into the substrate;
using a first implantation process to simultaneously implant at least one N-type dopant to a second depth in the substrate to form a channel region in the first N-well and a drain region in the first P-well;
using a second implantation process to simultaneously implant at least one P-type dopant to a third depth in the substrate to form a channel region in the second P-well and a drain region in the second N-well, wherein the second depth and the third depth are each less than the first depth;
forming PMOS and NMOS high voltage asymmetric transistors adjacent to one another on the substrate as a complementary transistor pair in the first P-well and the second N-well; and
forming PMOS and NMOS low voltage transistors adjacent to one another on the substrate as a complementary transistor pair in the second P-well and the first N-well.

18. The method of claim 17, wherein respective drain regions of the PMOS and NMOS high voltage asymmetric transistors are Lightly Doped Drain (LLD) regions.

19. The method of claim 17, wherein at least one of the first and second dopant implantation processes is a halo ion implantation process.

* * * * *